(12) United States Patent
Kawasaki et al.

(10) Patent No.: US 7,577,173 B2
(45) Date of Patent: Aug. 18, 2009

(54) SEMICONDUCTOR LASER DEVICE HAVING A LOW REFLECTION FILM OF STABLE REFLECTANCE

(75) Inventors: Kazushige Kawasaki, Tokyo (JP); Yasuyuki Nakagawa, Tokyo (JP); Hiromasu Matsuoka, Hyogo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 11/938,845

(22) Filed: Nov. 13, 2007

(65) Prior Publication Data

US 2008/0205468 A1 Aug. 28, 2008

(30) Foreign Application Priority Data

Feb. 26, 2007 (JP) ............................. 2007-045253

(51) Int. Cl.
*H01S 5/00* (2006.01)
(52) U.S. Cl. .................... 372/43.01; 372/49.01
(58) Field of Classification Search .............. 372/43.01, 372/49.01
See application file for complete search history.

(56) References Cited

U.S. PATENT DOCUMENTS

| | | | |
|---|---|---|---|
| 6,680,958 | B1 | 1/2004 | Nemoto |
| 7,031,362 | B2 | 4/2006 | Yoon et al. |
| 7,106,775 | B2 | 9/2006 | Matsuoka et al. |
| 7,410,819 | B2 | 8/2008 | Takakura et al. |
| 2004/0233959 | A1* | 11/2004 | Arakida ................. 372/49 |
| 2005/0190807 | A1* | 9/2005 | Toyama ............. 372/49.01 |

FOREIGN PATENT DOCUMENTS

| | | |
|---|---|---|
| JP | 3-145175 | 6/1991 |
| JP | 2001-077457 A | 3/2001 |
| JP | 2002-100830 | 4/2002 |
| JP | 2003-101126 | 4/2003 |
| JP | 2003-204110 | 7/2003 |
| JP | 2003-249724 A | 9/2003 |
| JP | 2004-214289 | 7/2004 |
| JP | 2004-296903 | 10/2004 |
| JP | 2004-327678 | 11/2004 |
| JP | 2005-123364 | 5/2005 |
| JP | 2005-340625 A | 12/2005 |
| JP | 2006-190980 A | 7/2006 |

* cited by examiner

*Primary Examiner*—Dung T Nguyen
(74) *Attorney, Agent, or Firm*—Leydig, Voit & Mayer, Ltd.

(57) ABSTRACT

A semiconductor laser device comprises a GaN substrate having a refractive index of 3.5 or below, a semiconductor layer laminated on the substrate, and a pair of facets forming a resonator and in face-to-face-relation to each other in a direction perpendicular to the direction of the laminated layer. One of the facets of the resonator includes a low reflection film, of a first dielectric film, a second dielectric film, a third dielectric film, and a fourth dielectric film. When the refractive indexes of these films are taken as $n_1$, $n_2$, $n_3$, and $n_4$, $n_1 = n_3$ and $n_2 = n_4$. The following relationship between the first dielectric film and the third dielectric film, and between the second dielectric film and the fourth dielectric film is established, $nd + n'd' = p\lambda/4$, where p is an integer, and $\lambda$ is oscillation wavelength of a laser beam generated by the semiconductor laser device.

4 Claims, 17 Drawing Sheets

SEMICONDUCTOR LASER DEVICE HAVING A LOW REFLECTION FILM OF STABLE REFLECTANCE

FIELD OF THE INVENTION

The present invention is related to a semiconductor laser device and more particularly, to a semiconductor laser device of a type wherein a reflection film is formed at an emission facet.

BACKGROUND ART

Generally, in semiconductor laser devices, an insulating film called coating film is attached to opposite facets of a resonator thereof for the purposes of reducing a working current, preventing optical feedback, creating high-power outputs and the like as disclosed in the patent publication of JP-3080312 or the laid open patent publications JP-A-2002-100830, JP-A-2003-101126 and JP-A-2004-296903.

Especially, in semiconductor laser devices demanded with high-power outputs, a coating film of low reflectance is formed at a front facet side (emission facet side), and a coating film of high reflectance is formed at a rear facet side, thereby creating high-power outputs. The reflectance of the rear facet coating film is not smaller than 60%, preferably not smaller than 80%. The reflectance of the front facet coating film may not be merely low, and its value is selected depending on the characteristics required for a semiconductor laser device. For instance, the reflectance is selected to be about 0.01-3% for semiconductor laser devices for fiber amplifier excitation used in combination with fiber gratings, about 3-7% for ordinary high-power semiconductor laser devices, and about 7-10% for the case where a measure for optical feedback is necessary.

In a high-power bluish purple semiconductor laser device of 50 mW or over using a GaN substrate, the reflectance at the emission front facet should have a value of about 5%-15%. If it is intended to obtain a reflectance of 6%, the reflectance control required is at 6±1%. In general, the reflectance at a front facet from which a laser beam is emitted in a semiconductor laser device is controlled by the thickness and refractive index of a single-layered dielectric film, e.g. by the thickness and refractive index of a dielectric film such as of $Al_2O_3$, $SiO_2$ or the like.

In FIG. 25, there is shown a construction view of a conventional semiconductor laser device whose oscillation wavelength is 405 nm. In the figure, the semiconductor laser comprises a GaN substrate 101, an active layer 102, upper and lower clad layers 103, an electrode 104, a low reflection film 112 formed at a laser front facet, and a high reflection film 107 formed at a laser rear facet. A laser beam 105 is emitted. It is usual that, for the low reflection film used at the laser front facet, there is used a single-layered film having such an optical thickness as to provide an integral multiple of $\lambda/4\pm\alpha$ (the reflectance is controlled by $\alpha$). At the front facet of the semiconductor laser, the density of a laser beam is so high that the temperature is likely to rise, under which this low reflection film plays a role as a heat dissipating plate (heat spreader). Accordingly, a $3\lambda/4\pm\alpha$ film of aluminum oxide is ordinarily used.

In general, the reflectance is calculated according to a matrix method using, as parameters, a refractive index of a substrate, a coating film thickness formed on the substrate and a refractive index thereof, and a free space (usually, air with a refractive index of 1).

In FIG. 26, the wavelength dependence of reflectance is shown in the case where an aluminum oxide film (refractive index: 1.664) whose $\alpha$ is set at 21.5 nm (film thickness: 204 nm) is disposed at a front facet of a bluish purple semiconductor laser device (refractive index of GaN substrate: 2.5) whose oscillation wavelength is at 405 nm. In FIG. 27, the thickness dependence is shown. From FIG. 27, it will be seen that in order to realize 6±1%, the film thickness has to be controlled at an accuracy of ±1% relative to a designed value of 204 nm. In this way, in the bluish purple semiconductor laser whose wavelength is as short as 405 nm, the coating film thickness becomes thinner, correspondingly to the wavelength ratio, than those of conventional lasers for DVD in the 680 nm band and for CD in the 780 nm band, thus requiring more precise control of the film thickness. Thus, when using film-forming techniques whose thickness control is at a level of about ±5%, such as vacuum deposition, sputtering and the like, a difficulty is involved in reflectance control, thus inviting a lowering of yield.

In the case where, for example, a reflectance of 6±1% is realized using conventional semiconductor laser devices having such constructions as set out above, it is necessary to suppress a variation of film thickness within ±1% for such an aluminum oxide single-layered film, with the attendant problem that the reflectance control lowers, thereby leading to degradation of yield. Hence, there is an urgent need to enable one to reliably, reproducibly select a reflectance at an emission facet depending on the purpose of a semiconductor laser.

The invention has been made in view of such problems as stated above. That is, an object of the invention is to obtain a semiconductor laser device wherein a reflectance can be stably controlled irrespective of the variation in thickness and refractive index of a dielectric film serving as a reflection film formed on a facet of a semiconductor laser.

Other objects and advantages of the invention will become apparent from the following description.

SUMMARY OF THE INVENTION

According to one aspect of the present invention, a semiconductor laser device comprises a GaN substrate and a semiconductor layer laminated on the substrate. A pair of facets of the resonator is in face-to-face relation to each other in a direction vertical to the direction of the lamination. A refection film is provided at one of facets of the resonator, and the reflection film is formed of a first dielectric film and a second dielectric film, made of materials different from each other, which are alternately laminated in four or more layers.

ADVANTAGEOUS EFFECT OF THE INVENTION

According to the present invention, even when the thickness and refractive index of a dielectric film serving as a reflection film formed on a facet of a semiconductor laser vary, there can be obtained a semiconductor laser device whose reflectance can be stably controlled.

DETAILED DESCRIPTION OF THE PREFERRED EMBODIMENTS

First Embodiment

An embodiment of the present invention will now be illustrated with reference to FIGS. 1 to 24.

Figure 1:
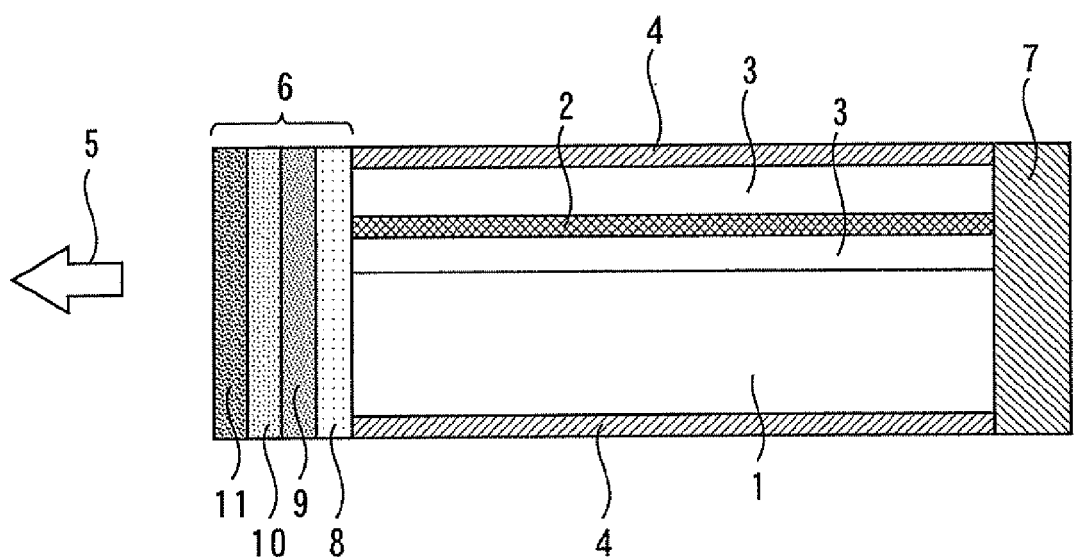
FIG. 1 is a schematic sectional view of a semiconductor laser device according to an embodiment of the present invention.

FIG. 1 is a schematic sectional view of a semiconductor laser device according to this embodiment. In this figure, the semiconductor laser device comprises a GaN substrate 1, an active layer 2, upper and lower clad layers 3, an electrode 4, a low reflection film 6 formed at a front facet, and a high reflection film 7 formed at a rear facet. A laser beam 5 is emitted. The low reflection film 6 formed at the front facet through which the laser beam 5 is emitted is constituted of a first dielectric film 8, a second dielectric film 9, a third dielectric film 10, and a fourth dielectric film 11, which have refractive indexes different from one another.

If the refractive indexes of the first dielectric film 8, second dielectric film 9, third dielectric film 10 and fourth dielectric film 11 are taken as $n_1$, $n_2$, $n_3$ and $n_4$, respectively, the types of film materials are so chosen as to provide the refractive indexes of the respective layers in such a way that $n_1=n_3$ and $n_2=n_4$.

In this embodiment, there can be used, as a semiconductor laser device, a bluish purple semiconductor laser device whose oscillation wavelength is at 405 nm. In this case, a GaN substrate having a refractive index of 2.5 can be used as a substrate. The low reflection film 6 can be formed using aluminum oxide having a refractive index of 1.664 as the first dielectric film 8 and the third dielectric film 10, and silicon oxide having a refractive index of 1.507 as the second dielectric film 9 and the fourth dielectric film 11, respectively.

The thicknesses of the first dielectric film 8, second dielectric film 9, third dielectric film 10 and fourth dielectric film 11 are all set at 1/(4n) of oscillation wavelength (wherein n is a refractive index). For instance, the first dielectric film 8 and the third dielectric film 10 can be set at 60.9 nm, and the second dielectric film 9 and the fourth dielectric film 11 can be at 67.2 nm, respectively. In this case, there is obtained a reflectance of 6.5% at an oscillation wavelength of 405 nm of the semiconductor laser.

Figure 2:
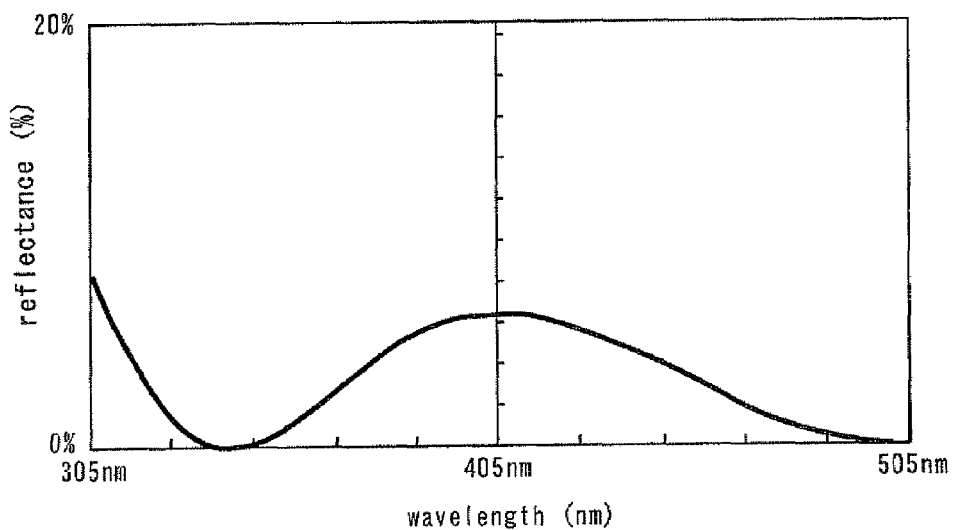
FIG. 2 shows the wavelength dependence of reflectance of a low refection film in the embodiment shown in FIG. 1.
Figure 3:
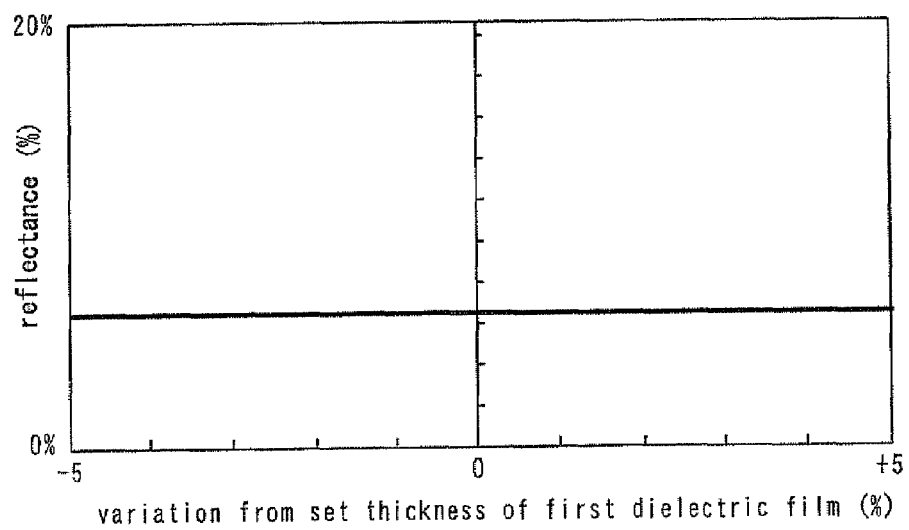
FIGS. 3 to 6 respectively shows the thickness dependence of reflectance of a low refection film in the embodiment shown in FIG. 1
Figure 4:
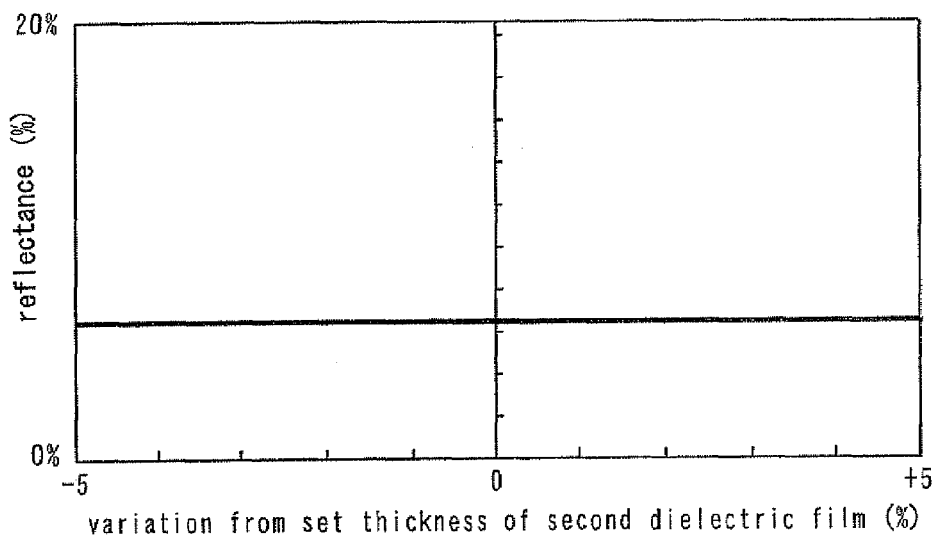
Figure 5:
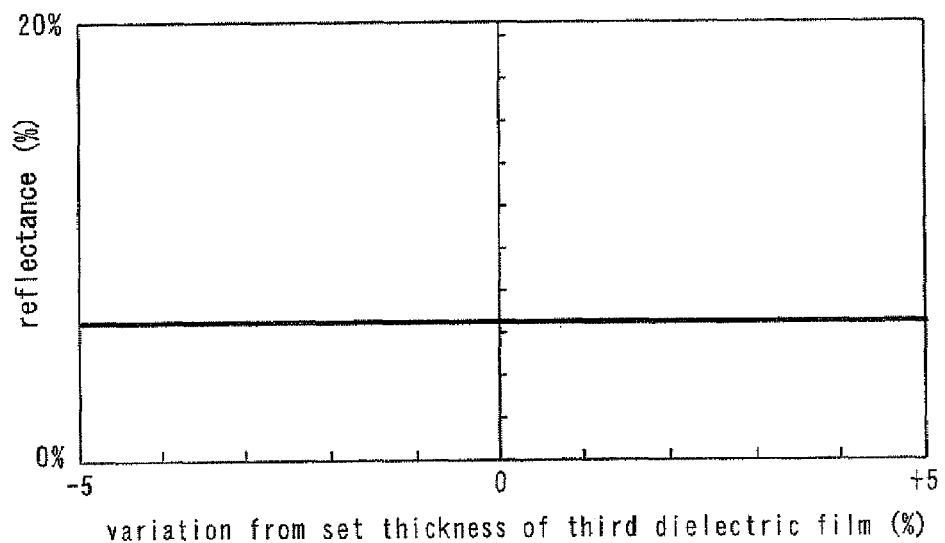
Figure 6:
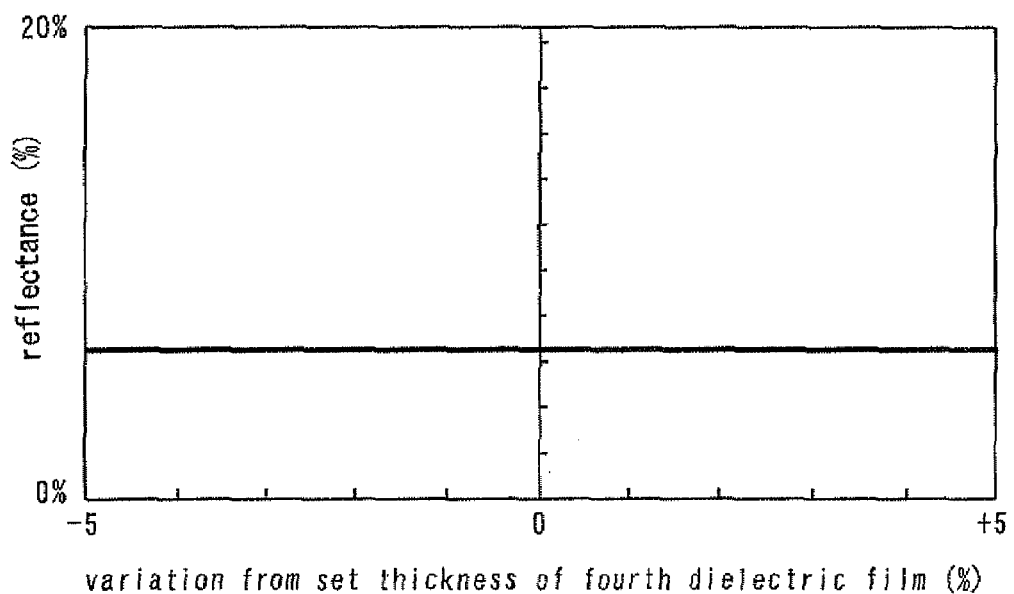

The wavelength dependence of reflectance in the case where such a low refection film is formed is shown in FIG. 2. From the figure, it will be seen that the reflectance at an oscillation wavelength of 405 nm becomes 6.5%.

In the case where the thicknesses of the first dielectric film 8, second dielectric film 9, third dielectric film 10 and fourth dielectric film 11 are, respectively, varied within ±5%, the dependences of reflectance are shown in FIGS. 3 to 6. As will be apparent from these figures, the low reflection film 6 so arranged as set out above is very stable relative to the variations in thickness of the respective films, and if the thicknesses of individual films are varied independently by 5%, the variation of reflectance can be suppressed to 1% or below in maximum.

In this way, the following relationship between the first dielectric film 8 and third dielectric film 10, and the second dielectric film 9 and fourth dielectric film 11 is established.

$$nd+n'd'=p\lambda/4 \text{ (p: an integer, } \lambda \text{: an oscillation wavelength of a laser beam)} \quad (1)$$

Thus, a reflection film 6 whose reflectance is small in variation relative to the variation in film thickness can be obtained. It will be noted that n is a refractive index of the first dielectric film 8 and the third dielectric film and d is a thickness thereof. Likewise, n' is a refractive index of the second dielectric film 9 and the fourth dielectric film and d' is a thickness thereof.

For instance, in the case where a low reflection film whose reflectance becomes 6-17% is realized, the thicknesses of the first dielectric film 8 and third dielectric film 10 are, respectively, set at 60-120 nm and the second dielectric film 9 and fourth dielectric film 11 are, respectively, set at 10-70 nm, under which the relationship of the equation (1) is established.

Instead of the above instance, there may be constituted a low reflection film 6 using a 92 nm thick aluminum oxide film having a refractive index of 1.664 as the first dielectric film 8 and third dielectric film 10, and a 47 nm thick silicon oxide film having a refractive index of 1.507 as the second dielectric film 9 and fourth dielectric film 11. In this case, a reflectance of 6.6% is obtained. In this connection, the sum of the products of the refractive indexes and thicknesses of the respective dielectric films, nd+n'd', increases by +10.6% from $p\lambda/4$ (p: 2, $\lambda$: 405 nm).

Figure 7:
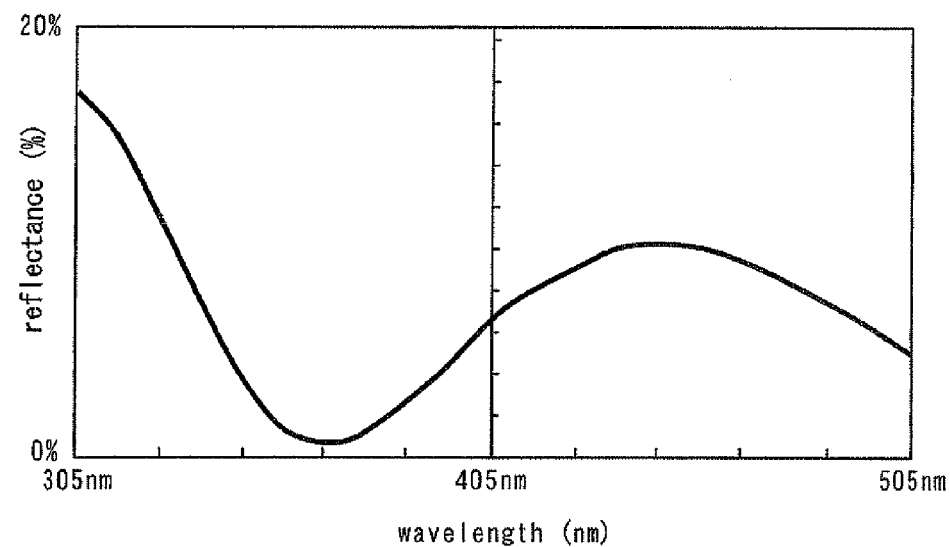
FIG. 7 shows the wavelength dependence of reflectance of another low refection film in the embodiment shown in FIG. 1.
Figure 8:
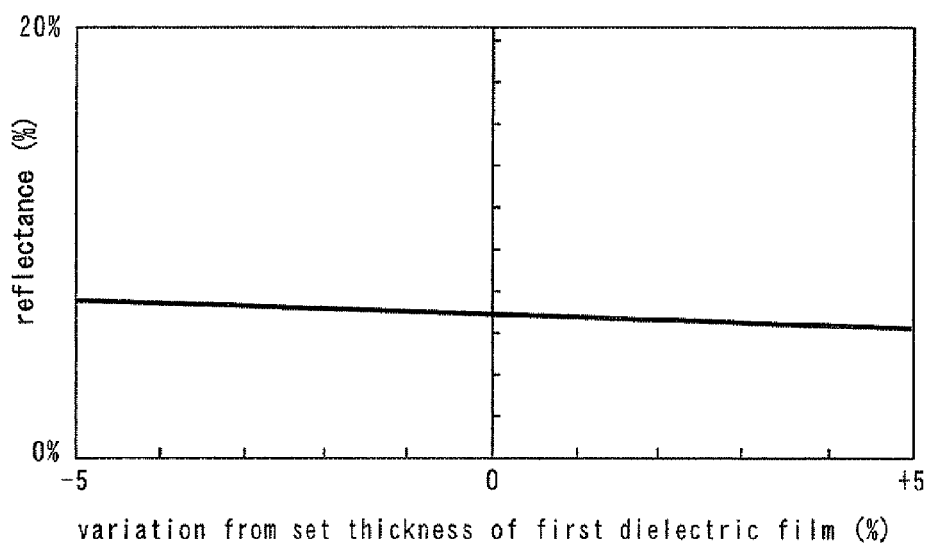
FIGS. 8 to 11 respectively shows the thickness dependence of reflectance of another low refection film in the embodiment shown in FIG. 1
Figure 9:
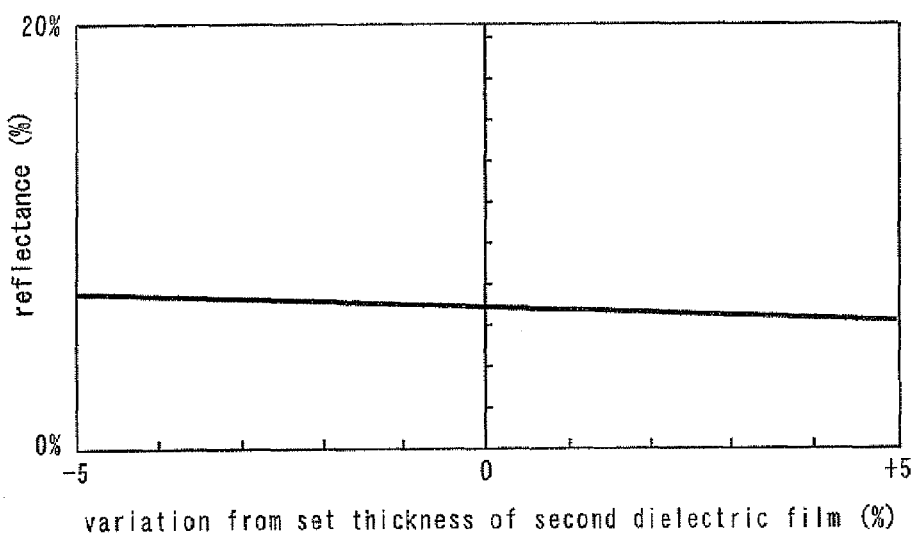
Figure 10:
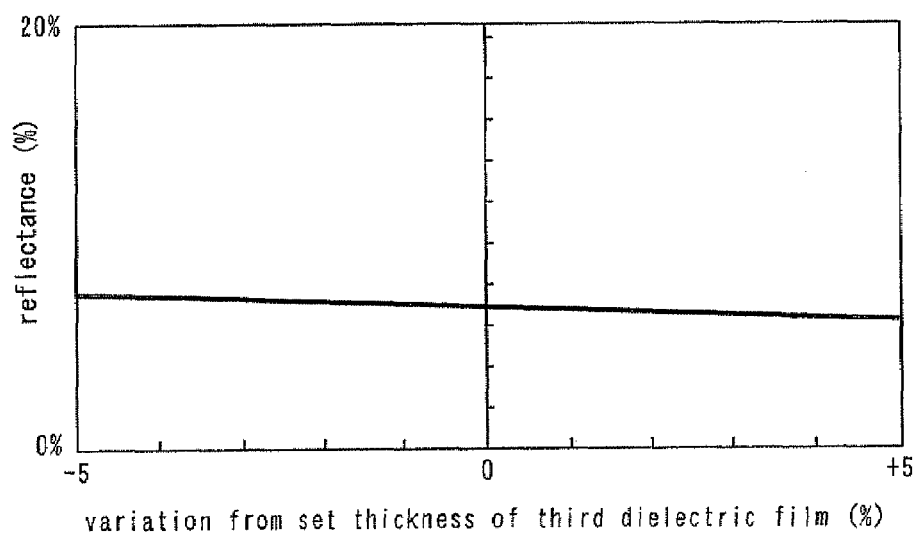
Figure 11:
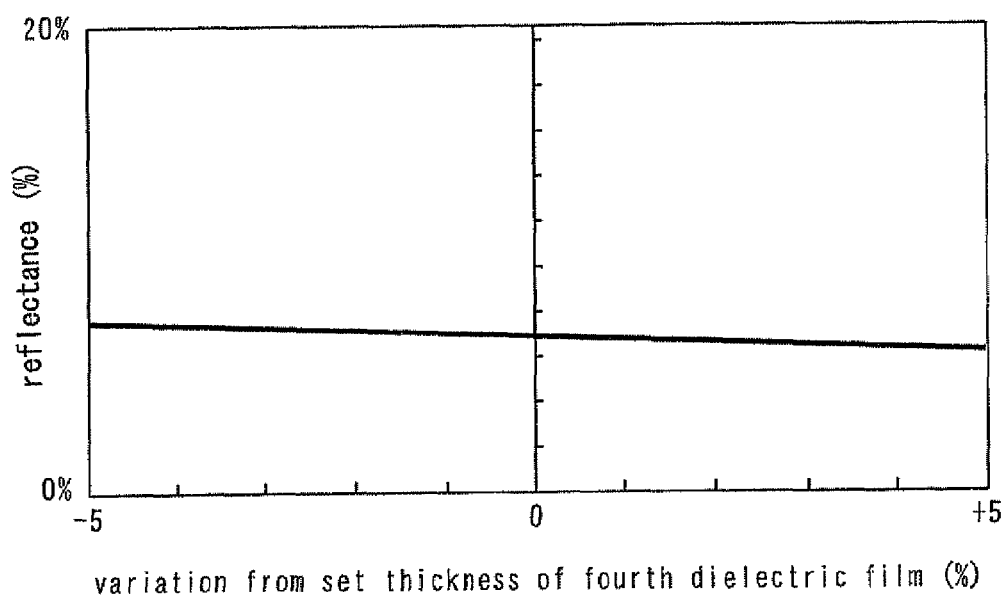

The wavelength dependence of reflectance of the low reflection film formed in such a way as set out above is shown in FIG. 7. The dependences of reflectance in the case where the thicknesses of the first dielectric film 8, second dielectric film 9, third dielectric film 10 and fourth dielectric film 11 are, respectively, varied within ±5% are shown in FIGS. 8-11. As will be apparent from these figures, the low reflectance film constructed as such is stable relative to the variation in thickness of the respective films, and if the thicknesses of individual films are varied independently by 5%, the variation of reflectance becomes 1.3% in maximum. However, since the variation is not at 1% or below, it may be favorable to set nd+n'd' within a range of ±10% from $p\lambda/4$ (p: an integer, $\lambda$: an oscillation wavelength of laser beam).

In the above instance, the case where the reflectance becomes 6.5 has been illustrated. It will be noted that with the reflection film of this construction, a desired reflectance can be obtained by controlling the thicknesses of the first to fourth dielectric films while keeping the feature that a variation in reflectance is very small relative to the variation in film thickness.

Figure 12:
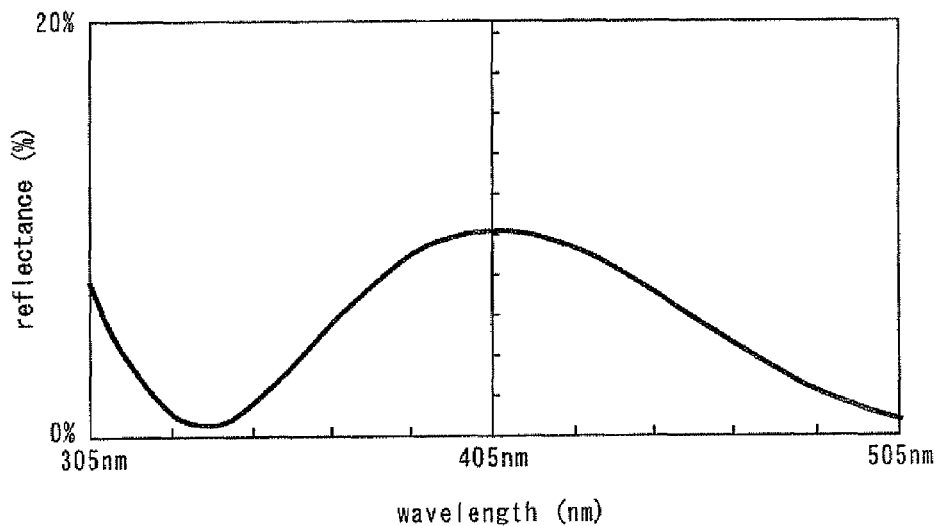
FIG. 12 shows the wavelength dependence of reflectance of still another low refection film in the embodiment shown in FIG. 1.
Figure 13:
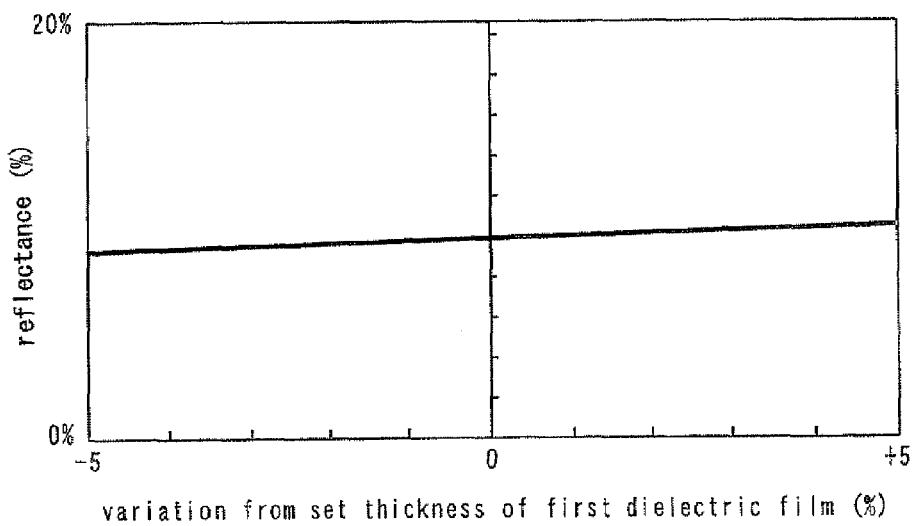
FIGS. 13 to 16 respectively shows the thickness dependence of reflectance of still another low refection film in the embodiment shown in FIG. 1
Figure 14:
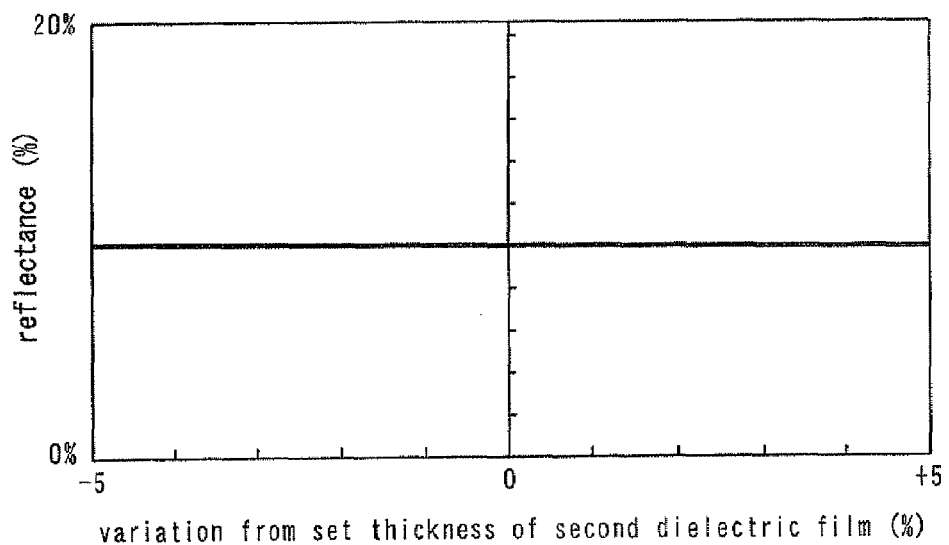
Figure 15:
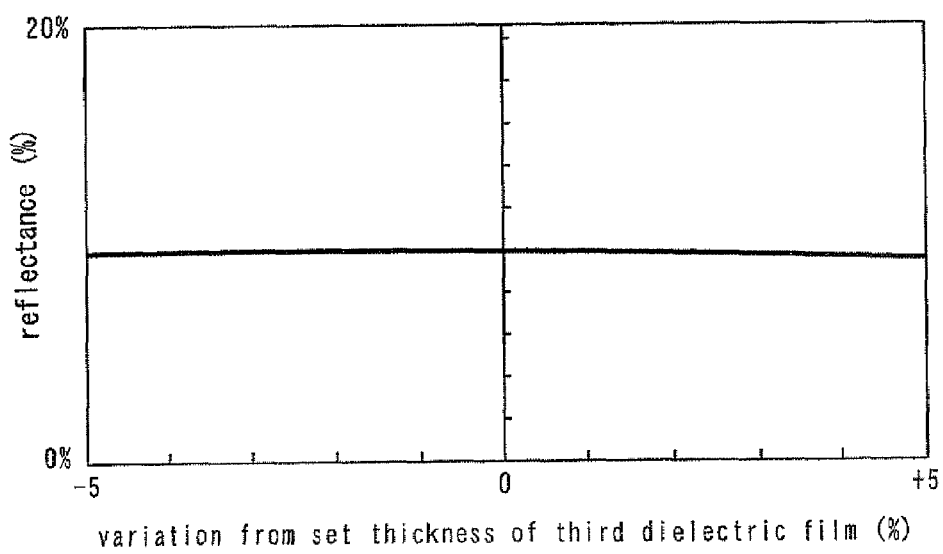
Figure 16:
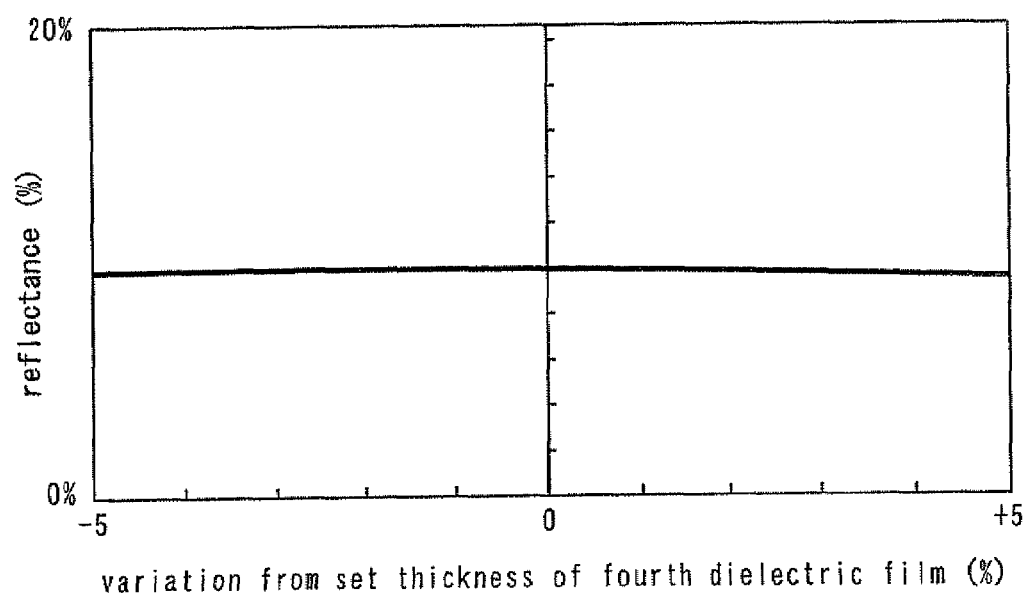

For instance, using such a film arrangement as set out above, a reflectance of 10% is obtained by setting the thicknesses of the first dielectric film 8 and third dielectric film 10 at 83.0 nm and those of the second dielectric film 9 and third dielectric film 11 at 44.0 nm, respectively. The wavelength dependence of reflectance is shown in FIG. 12. The dependences of reflectance in the case where the thicknesses of the first dielectric film 8, second dielectric film 9, third dielectric film 10 and fourth dielectric film 11 are, respectively, varied within ±5% are shown in FIGS. 13 to 16. As will be apparent from these figures, with the low reflection film as constructed above, the stabilities of the respective films relative to the variation in film thickness become slightly poorer than those of the case where the film thicknesses become ¼ of an oscillation wavelength of the semiconductor laser. However, if the thicknesses of individual films are varied independently by 5%, the variation of reflectance can be suppressed to 1% or below in maximum.

In the above instance, aluminum oxide was used as the first dielectric film 8 and third dielectric film 10, and silicon oxide was used for the second dielectric film 9 and fourth dielectric film 11. Needless to say, however, even when other types of materials are used, similar effects as shown above are obtainable by controlling the refractive indexes of the first, second, third and fourth dielectric films, taken as $n_1$, $n_2$, $n_3$ and $n_4$, respectively, in such a way that $n_1=n_3$ and $n_2=n_4$.

Figure 17:
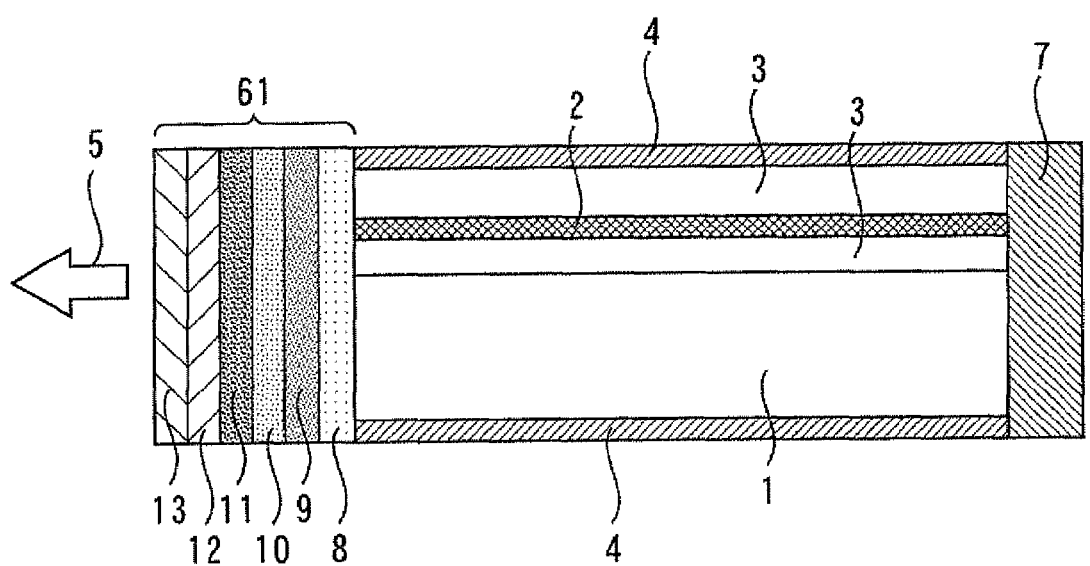
FIG. 17 is a schematic sectional view of another semiconductor laser device according to an embodiment of the present invention.

FIG. 17 shows an example wherein dielectric films are laminated in number of more than four to provide a low reflection film. More particularly, a six-layered dielectric film is used. It will be noted that the other structure is similar to that of FIG. 1, With the instance of FIG. 17, a low reflection film 61 is constituted of a first dielectric film 8, a second dielectric film 9, a third dielectric film 10, a fourth dielectric film 11, a fifth dielectric film 12 and a sixth dielectric film 13, refractive indexes of which differ from each other. In other words, the fifth dielectric film 12 and the sixth dielectric film 13 are added to the dielectric films of FIG. 1. When the refractive indexes of the respective dielectric films are taken as $n_1$, $n_2$, $n_3$, $n_4$, $n_5$ and $n_6$, the types of film materials are so chosen as to satisfy the relationships of $n_1=n_3=n_5$ and $n_2=n_4=n_6$.

In FIG. 17, the semiconductor laser device adapted may be a bluish purple semiconductor laser device having an oscillation wavelength of 405 nm. In this case, a GaN substrate having a refractive index of 2.5 can be used as a substrate. Aluminum oxide having a refractive index of 1.664 can be used for the first dielectric film 8, third dielectric film 10 and fifth dielectric film 12, and silicon oxide can be used for the second dielectric film 9, fourth dielectric film 11 and sixth dielectric film 13, thereby providing the low reflection film 61.

The first dielectric film 8, third dielectric film 10 and fifth dielectric film 12 are, respectively, set at 82 nm in thickness. The second dielectric film 9, fourth dielectric film 11 and sixth dielectric film 13 are, respectively, set at 46 nm in thickness. The dielectric films are so controlled as to establish the following relationship between the first dielectric film 8, third dielectric film 10 and fifth dielectric film 12 and the second dielectric film 9, third dielectric film 11 and sixth dielectric film 13 nd+n'd'=pλ/4 (p: an integer, λ: an oscillation wavelength of laser beam)

Figure 18:
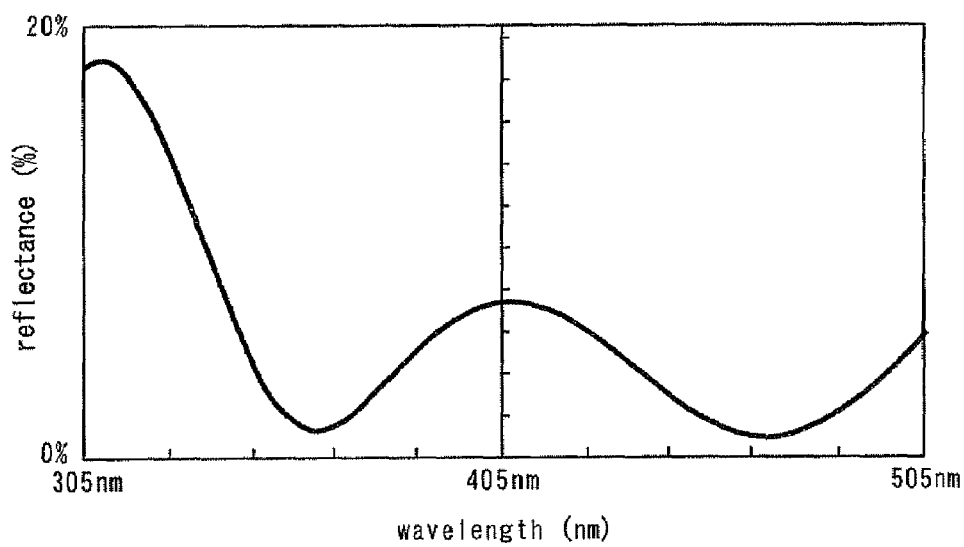
FIG. 18 shows the wavelength dependence of reflectance of a low refection film in the embodiment shown in FIG. 17.
Figure 19:
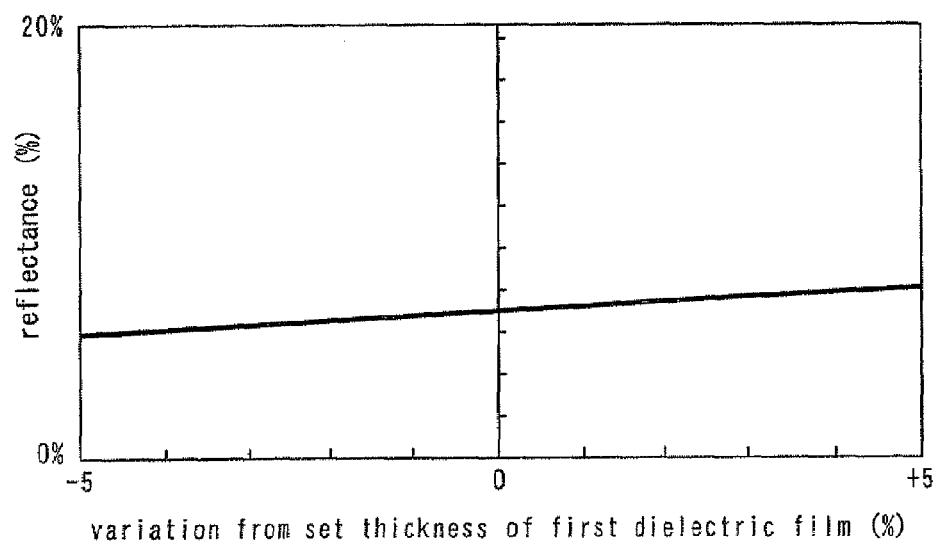
FIGS. 19 to 21 respectively shows the thickness dependence of reflectance of a low refection film in the embodiment shown in FIG. 17.
Figure 20:
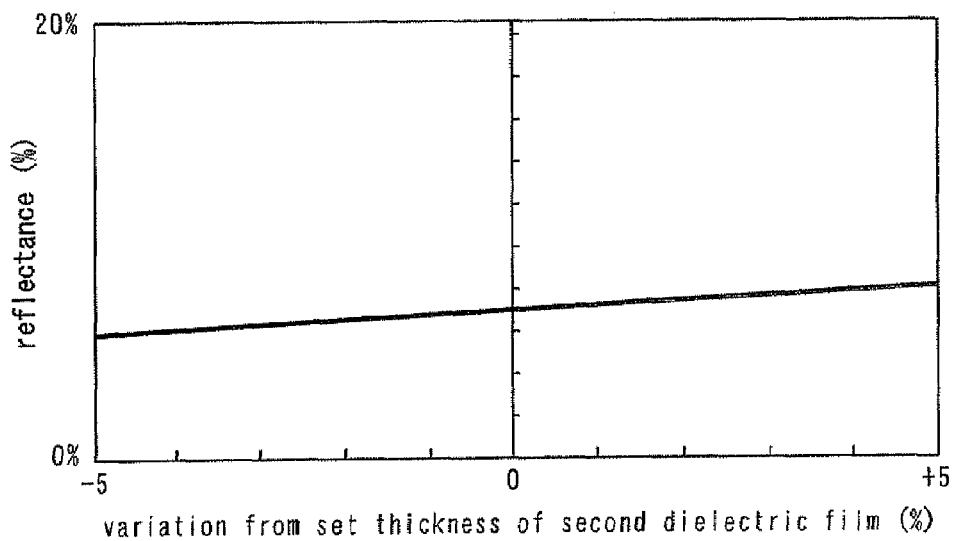
Figure 21:
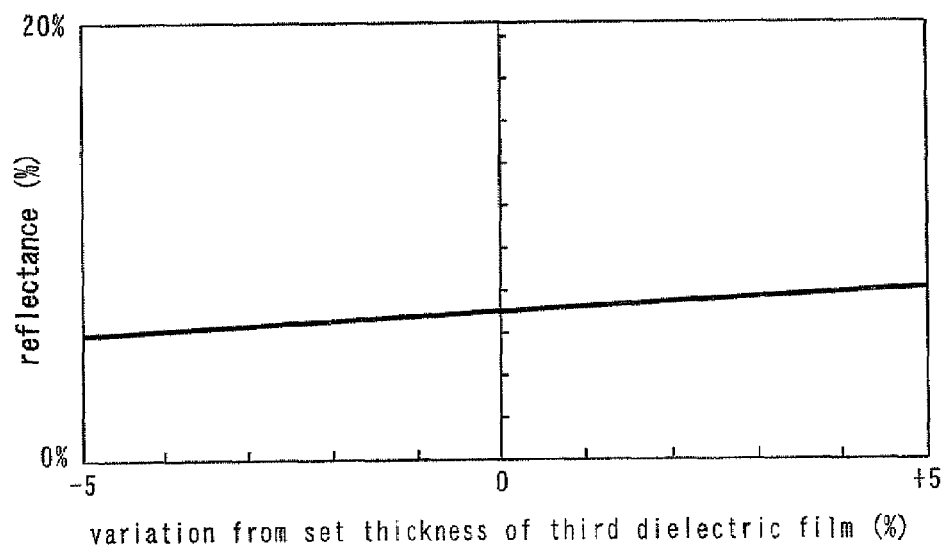
Figure 22:
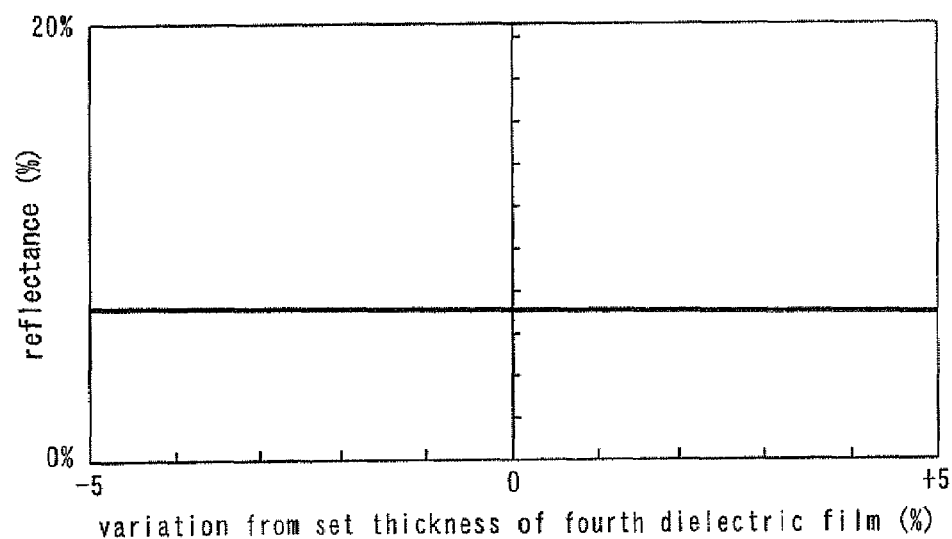
Figure 23:
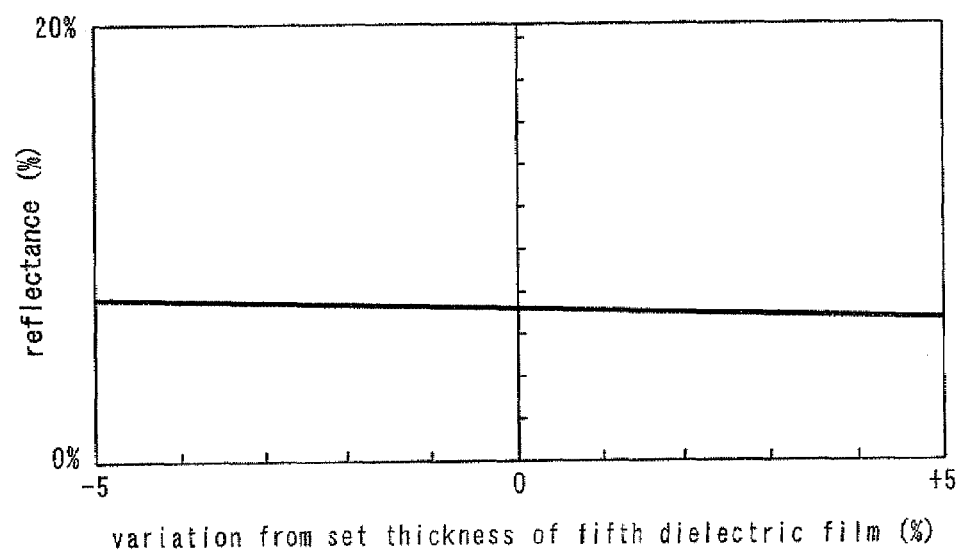
Figure 24:
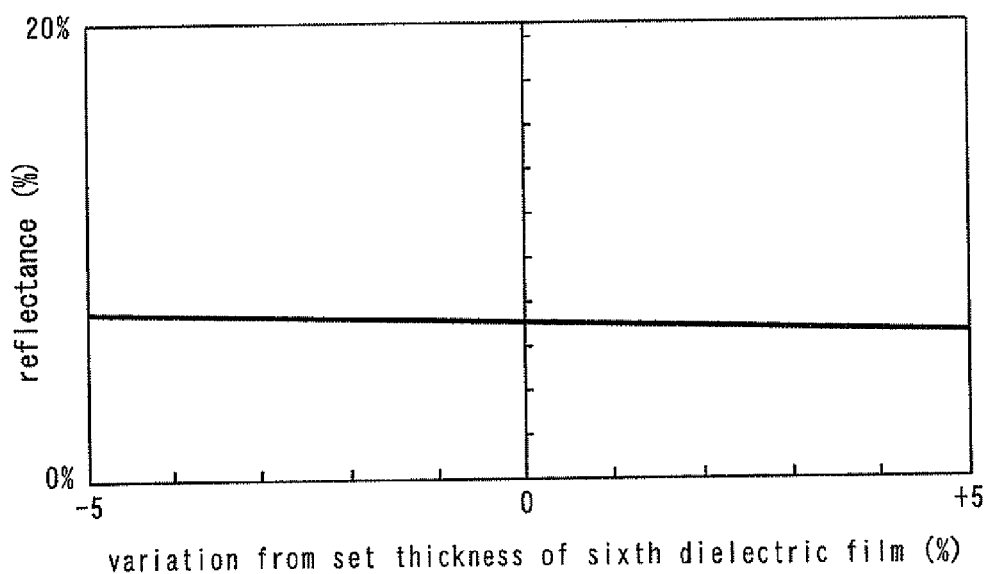
Figure 25:
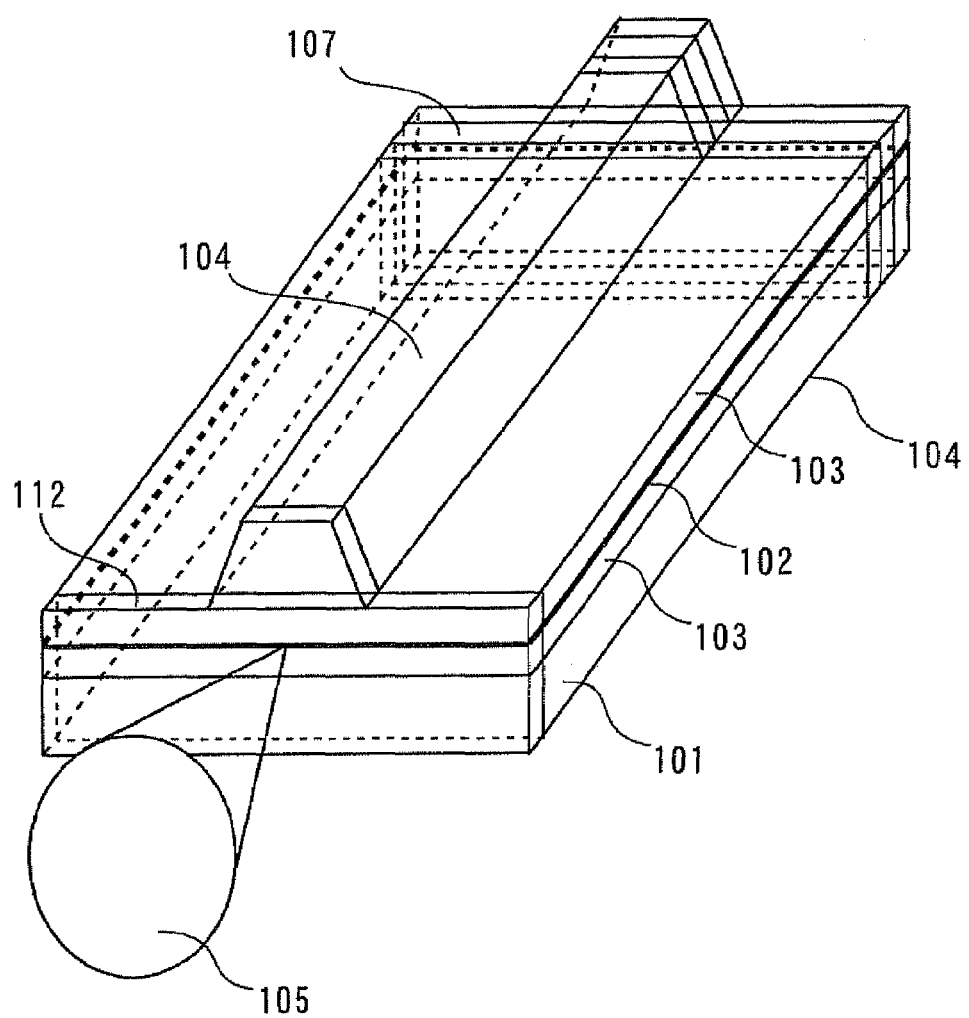
FIG. 25 shows a construction view of a conventional semiconductor laser device.
Figure 26:
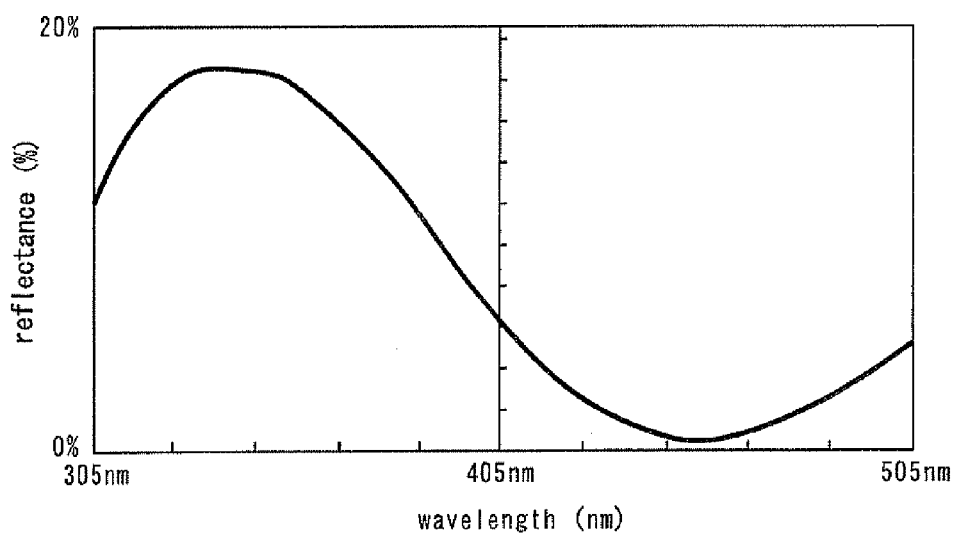
FIG. 26 shows the wavelength dependence of reflectance of a low refection film in the conventional semiconductor laser device shown in FIG. 25.
Figure 27:
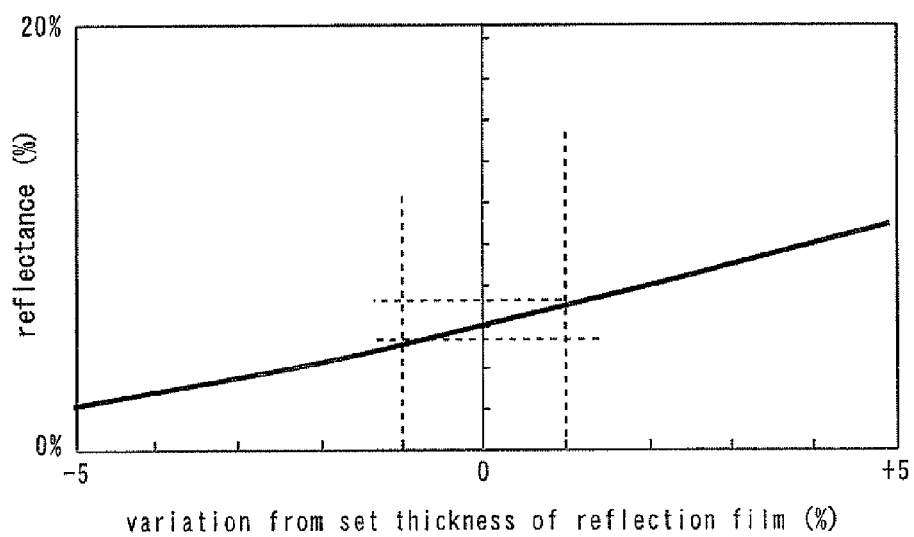
FIG. 27 shows the thickness dependence of reflectance of a low refection film in the conventional semiconductor laser device shown in FIG. 25.

The wavelength dependence of reflectance in the case where such a reflectance-controlled film is formed as in FIG. 17 is shown in FIG. 18. The dependences of reflectance in the case where the thicknesses of the first- to sixth-layered dielectric films are, respectively, varied within ±5% are shown in FIGS. 19 to 24. As will be apparent from these figures, the low reflection film of this construction is very stable relative to the variation in film thickness and even when the thicknesses of the films are varied independently by 5%, the variation of reflectance can be suppressed to 1% or below in maximum.

In order to obtain a reflectance-controlled film having a reflectance other than 7%, there can be realized a reflectance-controlled film with a small variation of reflectance relative to the variation in thickness by controlling the thicknesses of the first dielectric film 8, third dielectric film 10 and fifth dielectric film 12 and the second dielectric film 9, fourth dielectric film 11 and sixth dielectric film 13 to establish the following relationship therebetween: nd+n'd'=pλ/4 (p: an integer, λ: an oscillation wavelength of laser beam)

More particularly, in order to realize a reflectance-controlled film having a reflectance of 5-17%, control is made in such a way that the relationship of nd+n'd'=pλ/4 (p: an integer, λ: an oscillation wavelength of laser beam) is established, for example, within ranges where the thickness of the first dielectric film 8, third dielectric film 10 and fifth dielectric film 12 is at 70-120 nm and the thickness of the second dielectric film 9, fourth dielectric film 11 and sixth dielectric film 13 is at 10-60 nm.

It should be noted that in the above instance, aluminum oxide is used as the first dielectric film 8, third dielectric film 10 and fifth dielectric film 12, and silicon oxide is used as the second dielectric film 9, fourth dielectric film 11 and sixth dielectric film 13, respectively. Needless to say, however, similar effects are obtainable when the refractive indexes of the first dielectric film 8, second dielectric film 9, third dielectric film 10, fourth dielectric film 11, fifth dielectric film 12 and sixth dielectric film 13 are taken as $n_1$, $n_2$, $n_3$, $n_4$, $n_5$ and $n_6$ and the types of dielectric film materials are so chosen as to provide $n_1=n_3=n_5$ and $n_2=n_4=n_6$.

In the case where the dielectric films for the low reflection film are made of greater than six layers, e.g. eight layers, ten layers, twelve layers or more, the thickness control made in the same manner as set out above enables one to realize a reflectance-controlled film having a reflectance of 5-17%.

Similar effects are obtainable using, aside from $Al_2O_3$ and $SiO_2$ mentioned above, $TiO_2$, $ZrO_2$, $HfO_2$, AlN, amorphous Si, $Nb_2O_5$, $T_2O_5$ and the like.

It will be noted that the invention should not be construed as limiting to the above embodiment and various alterations may be possible without departing from the spirit of the invention.

That is, the invention may comprehend a semiconductor laser of a type which comprises a GaN substrate, a semiconductor layer laminated on the substrate, and a pair of facets of the resonator which are in face-to-face relation with each other in a direction vertical to the direction of the lamination. A reflection film is disposed at one of the resonator facets, and the reflection film is made of a laminate of four or more layers wherein a first dielectric film and a second dielectric Elm are alternately laminated. With this arrangement, the refractive index and thickness of the first dielectric film are taken as n and d, respectively, and the refractive index and thickness of the second dielectric film taken as n' and d', a value of (nd+n'd') should preferably be within a range of pλ/4 (p: an integer, λ: an oscillation wavelength of laser beam) ±10%. It is also preferred that an arbitrary reflectance is permitted to be obtained within a range of 5-17% at an oscillation wavelength by controlling the thicknesses of the first dielectric film and the second dielectric film.

The entire disclosure of a Japanese Patent Application No. 2007-045253, filed on Feb. 26, 2007 including specification, claims, drawings and summary, on which the Convention priority of the present application is based, are incorporated herein by reference in its entirety.

The invention claimed is:

1. A semiconductor laser device comprising:
   a GaN substrate;
   a semiconductor layer laminated on said GaN substrate;
   a resonator having front and rear facets which are in face-to-face relation to each other in a direction perpendicular to said semiconductor layer laminated on said GaN substrate; and
   a reflection film on said front facet of said semiconductor laser device from which laser light generated within said semiconductor laser is emitted, wherein said reflection film
      has a reflectance within a range of 5-17% at an oscillation wavelength $\lambda$ of the laser light generated within said semiconductor laser device,
      includes an even number of alternating first and second dielectric films of respective different materials, laminated from said front facet of said semiconductor laser device,
      includes a total number of said first and second dielectric films not less than four,
      each of said first dielectric films has a refractive index and thickness of, respectively, n and d, each of said second dielectric films has a refractive index and thickness of, respectively, n' and d', and (nd+n'd') is within a range of $p\lambda/4\pm10\%$, wherein p is an integer, and
      the dielectric constant n of said first dielectric film is larger than the dielectric constant n' of said second dielectric film.

2. The semiconductor laser device according to claim 1, wherein said reflection film includes a total of no more than twelve of said first and second dielectric films.

3. The semiconductor laser device according to claim 1, wherein said first dielectric film is aluminum oxide and said second dielectric film is silicon oxide.

4. The semiconductor laser device according to claim 3, wherein said reflection film includes a total of no more than twelve of said first and second dielectric films.

* * * * *